United States Patent
Adams et al.

(10) Patent No.: US 10,485,120 B1
(45) Date of Patent: Nov. 19, 2019

(54) ENCLOSURES INCLUDING AN INTERLOCKING DEVICE

(71) Applicant: EATON INTELLIGENT POWER LIMITED, Dublin (IE)

(72) Inventors: James W. Adams, Chatsworth, GA (US); Nick E. Klus, Cleveland, TN (US); Scott Bradley, Pelham, AL (US)

(73) Assignee: EATON INTELLIGENT POWER LIMITED, Dublin (IE)

(*) Notice: Subject to any disclaimer, the term of this patent is extended or adjusted under 35 U.S.C. 154(b) by 0 days.

(21) Appl. No.: 16/150,639

(22) Filed: Oct. 3, 2018

(51) Int. Cl.
*H05K 5/02* (2006.01)
*H05K 5/00* (2006.01)

(52) U.S. Cl.
CPC ......... *H05K 5/0208* (2013.01); *H05K 5/0021* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 2,704,301 A * | 3/1955 | Feketics | ............... | H05K 9/0001 174/363 |
| 3,122,401 A * | 2/1964 | Johnson | ................... | G07F 11/54 312/97.1 |
| 3,602,564 A * | 8/1971 | Lewin | ................... | E05B 65/463 312/219 |
| 3,888,558 A * | 6/1975 | Himsl | ................... | E05B 65/463 312/216 |
| 5,533,645 A * | 7/1996 | Wittern, Jr. | ................ | G07F 9/10 221/120 |
| 5,673,175 A * | 9/1997 | Carney | ................... | G06F 1/181 292/202 |
| 5,747,734 A * | 5/1998 | Kozlowski | ............. | H02B 1/305 174/37 |
| 6,158,942 A * | 12/2000 | Apple | ................. | G11B 15/6825 312/287 |
| 6,484,650 B1 * | 11/2002 | Stomski | .................... | E05G 5/02 109/6 |
| 7,385,141 B2 * | 6/2008 | Keith | ....................... | H04Q 1/06 174/135 |
| 2002/0177922 A1 * | 11/2002 | Bloom | ................... | G06Q 20/00 700/213 |
| 2003/0174487 A1 * | 9/2003 | Garmong | ............. | H05K 9/0001 361/816 |
| 2008/0022673 A1 * | 1/2008 | Morris | .................... | F02D 11/02 60/431 |
| 2008/0106870 A1 * | 5/2008 | Dully | .................... | G06F 1/1632 361/724 |

(Continued)

*Primary Examiner* — Xanthia C Cunningham
(74) *Attorney, Agent, or Firm* — Squire Patton Boggs US LLP

(57) ABSTRACT

An enclosure assembly includes a plurality of enclosures. Each enclosure of the plurality of enclosures includes a cabinet including an interior surface defining an interior volume, and a door mounted relative to a respective opening of each cabinet. An interlocking device interlocks a first door of a first enclosure of the plurality of enclosures, a second door of a second enclosure of the plurality of enclosures, and a third door of a third enclosure of the plurality of enclosures. The interlocking device is operable to selectively fasten each of the first door, the second door, and the third door in a closed position.

20 Claims, 6 Drawing Sheets

(56) References Cited

U.S. PATENT DOCUMENTS

| | | | | |
|---|---|---|---|---|
| 2010/0019631 A1* | 1/2010 | Olson | A47B 53/02 312/201 |
| 2011/0110049 A1* | 5/2011 | Lehtola | H05K 7/1409 361/724 |
| 2012/0089540 A1* | 4/2012 | Manivilovski | E05B 39/02 705/500 |
| 2013/0086804 A1* | 4/2013 | Mawatari | H05K 13/021 29/825 |
| 2013/0256102 A1* | 10/2013 | Hager | E05C 1/08 200/50.03 |
| 2013/0264026 A1* | 10/2013 | Eckberg | B23P 15/26 165/67 |
| 2015/0186840 A1* | 7/2015 | Torres | A47B 81/00 705/339 |
| 2016/0248233 A1* | 8/2016 | Leidig | H05K 5/0208 |
| 2016/0284486 A1* | 9/2016 | Yee | H02B 1/36 |
| 2017/0243701 A1* | 8/2017 | Sinthomez | H01H 3/10 |
| 2018/0090914 A1* | 3/2018 | Johnson | H01H 33/66 |

\* cited by examiner

ENCLOSURES INCLUDING AN
INTERLOCKING DEVICE

FIELD OF INVENTION

The present disclosure relates to enclosures. More specifically, the present disclosure relates to enclosures for electrical distribution systems including an interlocking device.

BACKGROUND

Electric power can be supplied from an active device (e.g., power source) to a passive device (e.g., load source). For example, power stations can generate electric power; electric power companies can supply the electric power through an electric circuit (e.g., electric power grid) to consumers; and consumers can employ one or more devices to convert the electric power into energy to accomplish a variety of objectives. Accordingly, among other reasons, the ability to distribute electric power safely and effectively is important in the daily operation of an industrial society.

Moreover, enclosures for electrical distribution systems can play an integral role in the safe and effective distribution of electric power. For example, enclosures for electrical distribution can include one or more features providing utility, including housing electrical components, isolating the electrical components from an environment, reducing or preventing unauthorized access to the electrical components contained within the enclosure, and reducing or preventing unauthorized contact with the electric power present within the enclosure. Accordingly, enclosures including an interlocking device are needed for safe and effective distribution of electric power.

SUMMARY

In one embodiment, an enclosure assembly includes a plurality of enclosures. Each enclosure of the plurality of enclosures includes a cabinet including an interior surface defining an interior volume, and a door mounted relative to a respective opening of each cabinet. The door is oriented to provide access into the respective interior volume of each respective cabinet when the door is positioned in an open position relative to the respective opening, and the door is oriented to restrict access into the respective interior volume of each respective cabinet when the door is positioned in a closed position relative to the respective opening. The enclosure assembly includes an interlocking device interlocking a first door of a first enclosure of the plurality of enclosures, a second door of a second enclosure of the plurality of enclosures, and a third door of a third enclosure of the plurality of enclosures. The interlocking device is operable to selectively fasten each of the first door, the second door, and the third door in the closed position.

In another embodiment, an enclosure assembly includes a plurality of enclosures. Each enclosure of the plurality of enclosures includes a cabinet including an interior surface defining an interior volume, and a door mounted relative to a respective opening of each cabinet. The enclosure assembly includes an interlocking device interlocking a first door of a first enclosure of the plurality of enclosures, a second door of a second enclosure of the plurality of enclosures, and a third door of a third enclosure of the plurality of enclosures. The second enclosure is mounted relative to the first enclosure at a first interface defining a first boundary between the first cabinet and the second cabinet, and the third enclosure is mounted relative to the second enclosure at a second interface defining a second boundary between the second cabinet and the third cabinet. The enclosure assembly includes a first aperture defining a first opening in the first boundary and a second aperture defining a second opening in the second boundary. The interlocking device includes a cable actuator including a cable extending from the interior volume of the first cabinet through the first opening in the first boundary to the interior volume of the second cabinet. The interlocking device includes a link including a first end disposed in the interior volume of the second cabinet and a second end disposed in the interior volume of the third cabinet. The link extends from the interior volume of the second cabinet through the second opening in the second boundary to the interior volume of the third cabinet.

In yet another embodiment, an interlocking device for interlocking a plurality of doors of a plurality of enclosures includes a linkage defining a rotation axis between a first end of the linkage and a second end of the linkage about which the first end of the linkage and the second end of the linkage are rotatable. The interlocking device includes a cable actuator including a cable and an actuator, and the actuator includes a tip portion coupled to the first end of the linkage. The interlocking device includes a link including a first end coupled to the second end of the linkage, and a second end including a pin portion. The pin portion is oriented to selectively engage a slot of a hasp on a door of the plurality of doors based at least in part on actuation of the actuator.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
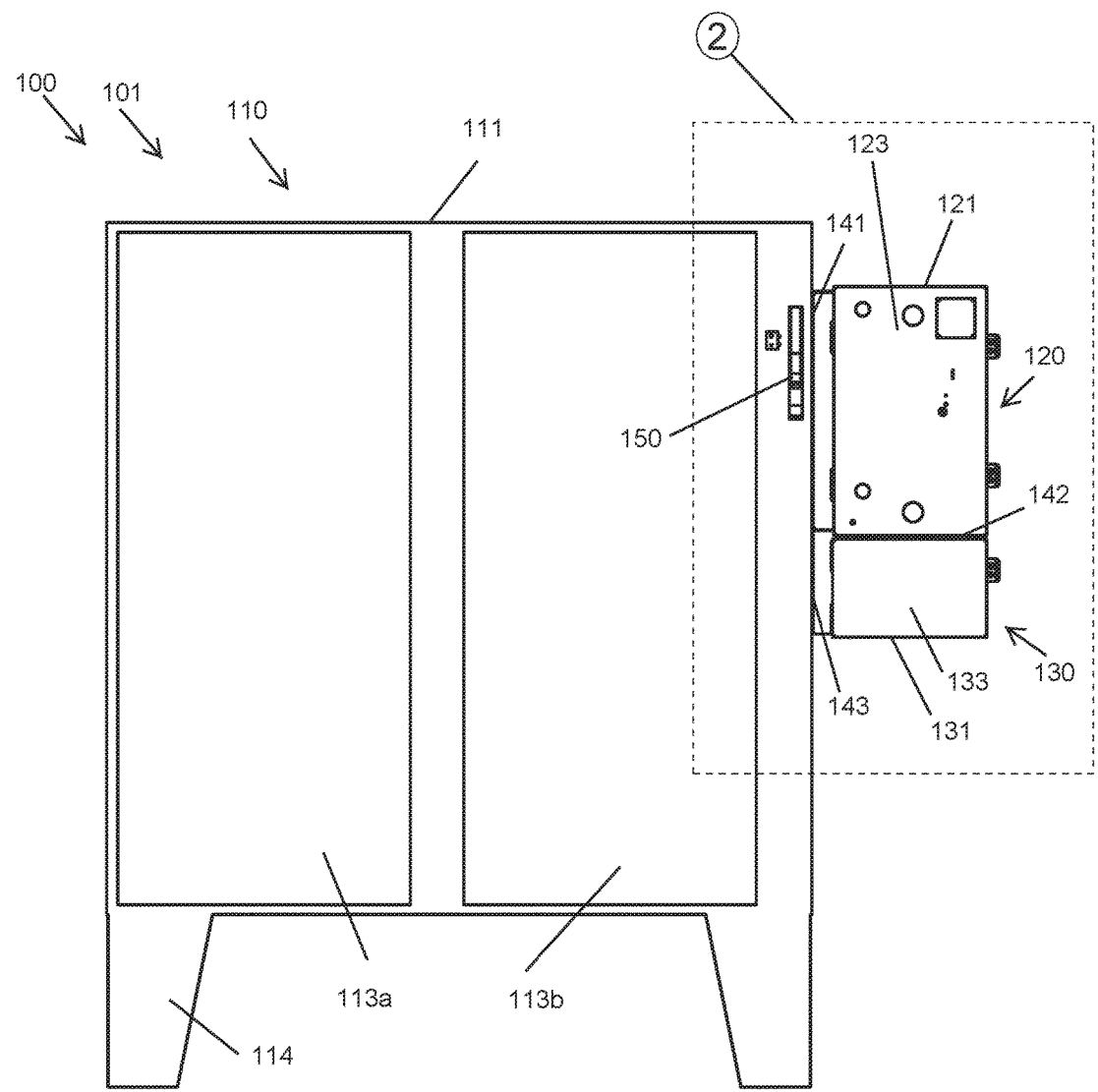
FIG. 1 is a schematic illustration of a front view of an exemplary enclosure assembly including a plurality of enclosures for an electric distribution system, in accordance with embodiments of the disclosure.

FIG. 1 is a schematic illustration of a front view of an exemplary enclosure assembly 100 in accordance with embodiments of the disclosure. In some embodiments, the enclosure assembly 100 can include a plurality of enclosures 101. For example, in some embodiments, the enclosure assembly 100 can include a first enclosure 110, a second enclosure 120, and a third enclosure 130. Although three enclosures 110, 120, 130 are shown, unless otherwise noted, it is to be understood that in some embodiments more than three enclosures (e.g., four, five, six, or more) enclosures can be provided in accordance with embodiments of the disclosure, without departing from the scope of the disclosure.

It should be understood that in some embodiments the enclosure assembly 100 can be employed as an enclosure assembly 100 for storage where the plurality of enclosures 101 can contain one or more electrical or non-electrical objects, without providing electrical distribution and without departing from the scope of the disclosure.

In some embodiments, the first enclosure 110 can include a cabinet 111, the second enclosure 120 can include a cabinet 121, and the third enclosure 130 can include a cabinet 131. In some embodiments, the cabinets 111, 121, 131 can include at least one of separate panels (e.g., sheets of metal) that are connected together and one or more panels that are machined or formed to define a predetermined structural shape of the cabinets 111, 121, 131. For example, in some embodiments, the cabinets 111, 121, 131 can include a predetermined structural shape defining one or more hollow polyhedron shells including an interior volume, such as rectangular boxes and hollow cuboids.

Figure 2:
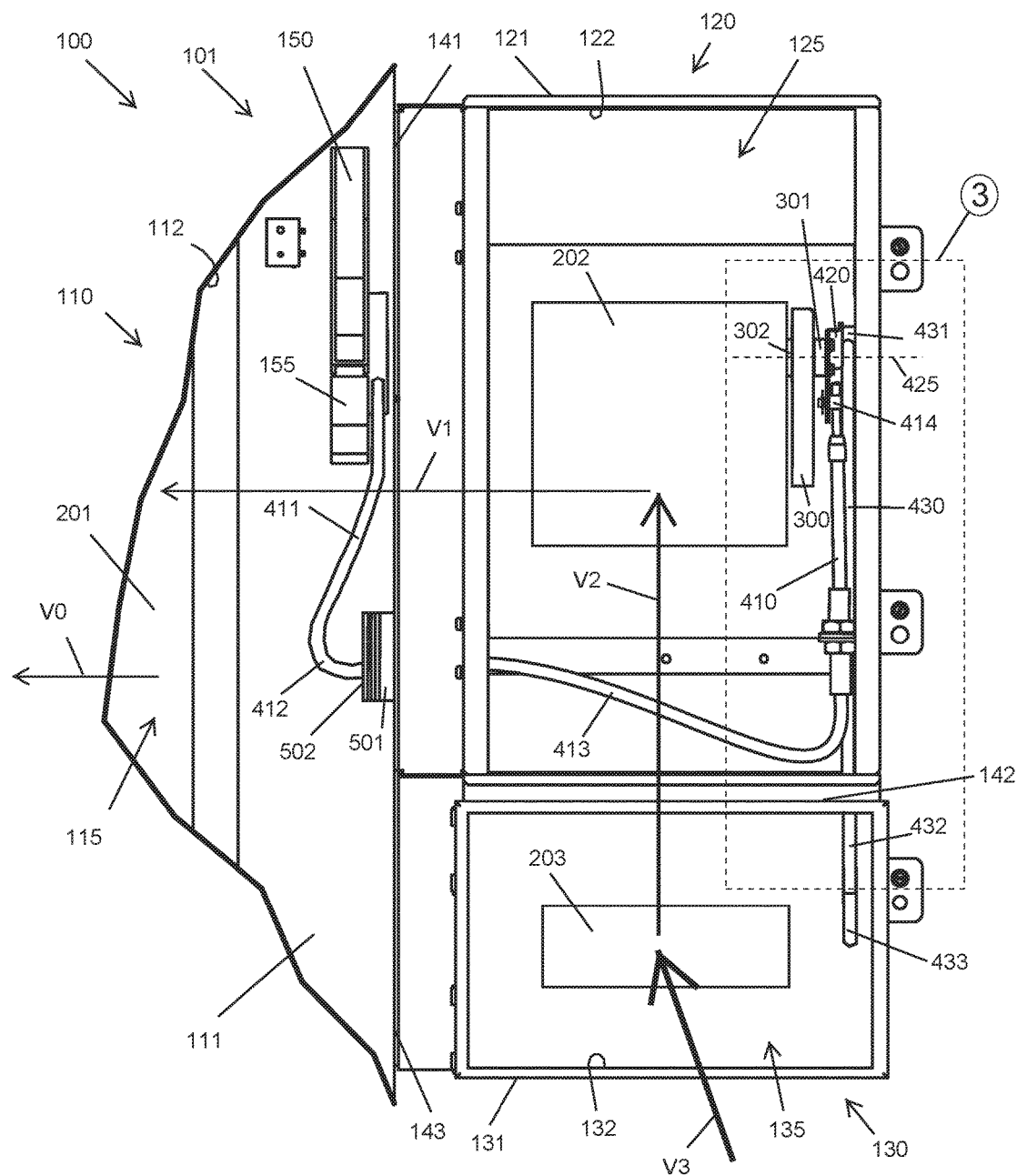
FIG. 2 is an enlarged view of a portion of the exemplary enclosure assembly of FIG. 1 taken at view 2 of FIG. 1 including an exemplary interlocking assembly in accordance with embodiments of the disclosure.

Additionally, in some embodiments, the enclosures 110, 120, 130 can include one or more doors 113a, 113b, 123, 133 oriented to provide and restrict access into an interior volume 115, 125, 135 (See e.g., FIG. 2) of the cabinets 111, 121, 131. FIG. 2 shows an enlarged view of a portion of the exemplary enclosure assembly 100 of FIG. 1 taken at view 2 of FIG. 1, with doors 113a, 113b, 123, 133 removed for pictorial clarity. In the illustrated embodiment, the cabinet 111 of the first enclosure 110 includes an interior surface 112 defining the interior volume 115 of the cabinet 111. Similarly, in some embodiments, the cabinet 121 of the second enclosure 120 includes an interior surface 122 defining the interior volume 125 of the cabinet 121, and the cabinet 131 of the third enclosure 130 includes an interior surface 132 defining the interior volume 135 of the cabinet 131.

Turning back to FIG. 1, the doors 113a, 113b, 123, 133 are mounted relative to a respective opening of the cabinets 111, 121, 131 to selectively provide and selectively restrict access into the respective interior volumes 115, 125, 135 of the cabinets 111, 121, 131. While four doors 113a, 113b, 123, 133 are shown in the illustrated embodiment, it should be understood that any number of doors may be employed. Moreover, in some embodiments, one or more of the doors 113a, 113b, 123, 133 can include one or more of a mechanical hinge, a mechanical fastener, a mechanical latch, and other mounting hardware oriented to mount the doors 113a, 113b, 123, 133 relative to a respective opening of the cabinets 111, 121, 131.

In some embodiments one or more of the cabinets 111, 121, 131 of the enclosures 110, 120, 130 can be mounted to a frame or other support structure (e.g., wall) and/or placed on a support structure (e.g., ground, floor, platform). For example, as shown with respect to the first enclosure 110, the enclosure 110 can include a base 114 to structurally support cabinet 111 at a predetermined distance relative to a support structure. Additionally, in some embodiments, the cabinet 111 of the first enclosure 110 can be coupled to the cabinet 121 of the second enclosure 120 at an interface defining a boundary 141, and the cabinet 121 of the second enclosure 120 can be coupled to the cabinet 131 of the third enclosure 130 at an interface defining a boundary 142. Optionally, in some embodiments, the cabinet 131 of the third enclosure 130 can be coupled to the cabinet 111 of the first enclosure 110 at an interface defining a boundary 143. In some embodiments, one or more boundaries 141, 142, 143 between cabinets 111, 121, 131 can include one or more of a fastener (e.g., bolt, screw, rivet), an adhesive (e.g., glue, bonding compound), a gasket (e.g., seal); and, in some embodiments, an electrical insulator to electrically insulate one or more of the cabinets 111, 121, 131 relative to each other.

Additionally, in some embodiments, one or more fasteners (e.g., bolt lock, latch, hasp, hook, rod, pad lock, key lock, combination lock) can be provided to secure one more of the doors 113a, 113b, 123, 133 in a closed positioned relative to the opening of the cabinets 111, 121, 131 to securely prevent unwanted or unintentional access to the interior volumes 115, 125, 135 of the cabinets 111, 121, 131. The enclosure assembly 100 can include a handle 150 operable to at least one of lock and unlock one or more of the doors 113a, 113b, 123, 133 of the cabinets 111, 121, 131.

In some embodiments the enclosure assembly 100 may be employed for electrical distribution, fastening (e.g., selectively fastening, securing, locking) one or more of the doors 113a, 113b, 123, 133 in a closed position can provide a predetermined level of security to ensure safe and effective operation of the enclosure assembly 100 for electrical distribution. Likewise, in some embodiments, providing a handle 150 operable to fasten (e.g., at least one of lock and unlock) one or more of the doors 113a, 113b, 123, 133 of the cabinets 111, 121, 131 can provide a predetermined level of security, operability, and predictability with respect to interaction of one or more users with one or more features of the enclosure assembly 100.

For purposes of explanation and not limitation, in some embodiments, electric power can be supplied from an active device (e.g., power source) to a passive device (e.g., load source). For example, power stations can generate electric power; electric power companies can supply the electric power through an electric circuit (e.g., electric power grid) to consumers; and consumers can employ one or more devices to convert the electric power into energy to accomplish a variety of objectives. Accordingly, among other reasons, the ability to distribute electric power safely and effectively can be important in the daily operation of an industrial society.

Moreover, enclosures 110, 120, 130 for electrical distribution, in accordance with embodiments of the disclosure, can play an integral role in the safe and effective distribution of electric power. Thus, as schematically illustrated in FIG. 2, the enclosures 110, 120, 130 for electrical distribution can include one or more features providing utility, including, but not limited to, housing electrical components (illustrated schematically as electrical components 201, 202, 203 in FIG. 2), isolating the electrical components 201, 202, 203 from an environment (e.g., weather, hazardous conditions) in which the electrical components 201, 202, 203 may be employed, reducing or preventing unauthorized access to the electrical components 201, 202, 203 contained within the enclosures 110, 120, 130, and reducing or preventing unauthorized contact with the electric power (illustrated schematically as voltages V0, V1, V2, V3) present within the enclosures 110, 120, 130.

In some embodiments, and for purposes of explanation and not limitation, one or more active devices (not shown) can supply voltage V3 (from a location external to the interior volume 135 of cabinet 131) to the electrical components 203 contained within the interior volume 135 of the cabinet 131. For example, in some embodiments, active devices can include electric generators, batteries, and other devices oriented to produce electric power (e.g., voltage V3). Additionally, and for purposes of explanation and not limitation, one or more passive devices (not shown) can be oriented to consume electric power. For example, in some embodiments, voltage V0 can be supplied from the electrical components 201 contained within the interior volume 115 of cabinet 111 to one or more passive device located externally to the interior volume 115 of the cabinet 111. In some embodiments, passive devices can include electric motors, electric appliances, and other devices oriented to consume (e.g., convert) the electric power (e.g., voltage V0) into one or more other forms of energy including, mechanical work (e.g., motion), light, and heat.

One aspect of electrical distribution, employing one or more enclosure assemblies 100 in accordance with embodiments of the disclosure, can include the delivery of electric power from producers to consumers, including commercial businesses, residential homes, and individuals. Another aspect of electric distribution can include stepping down (e.g., reducing) a transmission level voltage of the electric power (e.g., from a power station) to a distribution level voltage (e.g., at a substation), and again stepping down the distribution level voltage to a service level voltage (e.g., at a consumer). For example, enclosures 110, 120, 130 for electrical distribution can house a variety of electrical components 201, 202, 203 (e.g., wires, capacitors, inductors, transformers, reducers, amplifiers, fuses, switches, connectors, detectors, sensors, transducers, resonators, semiconductors, cables, timers, tubes, suppressors, terminals, etc.) oriented to provide, either alone or in combination, one or more operations or functions with respect to distribution of electric power from, for example, one or more active devices to one or more passive devices.

Figure 3:
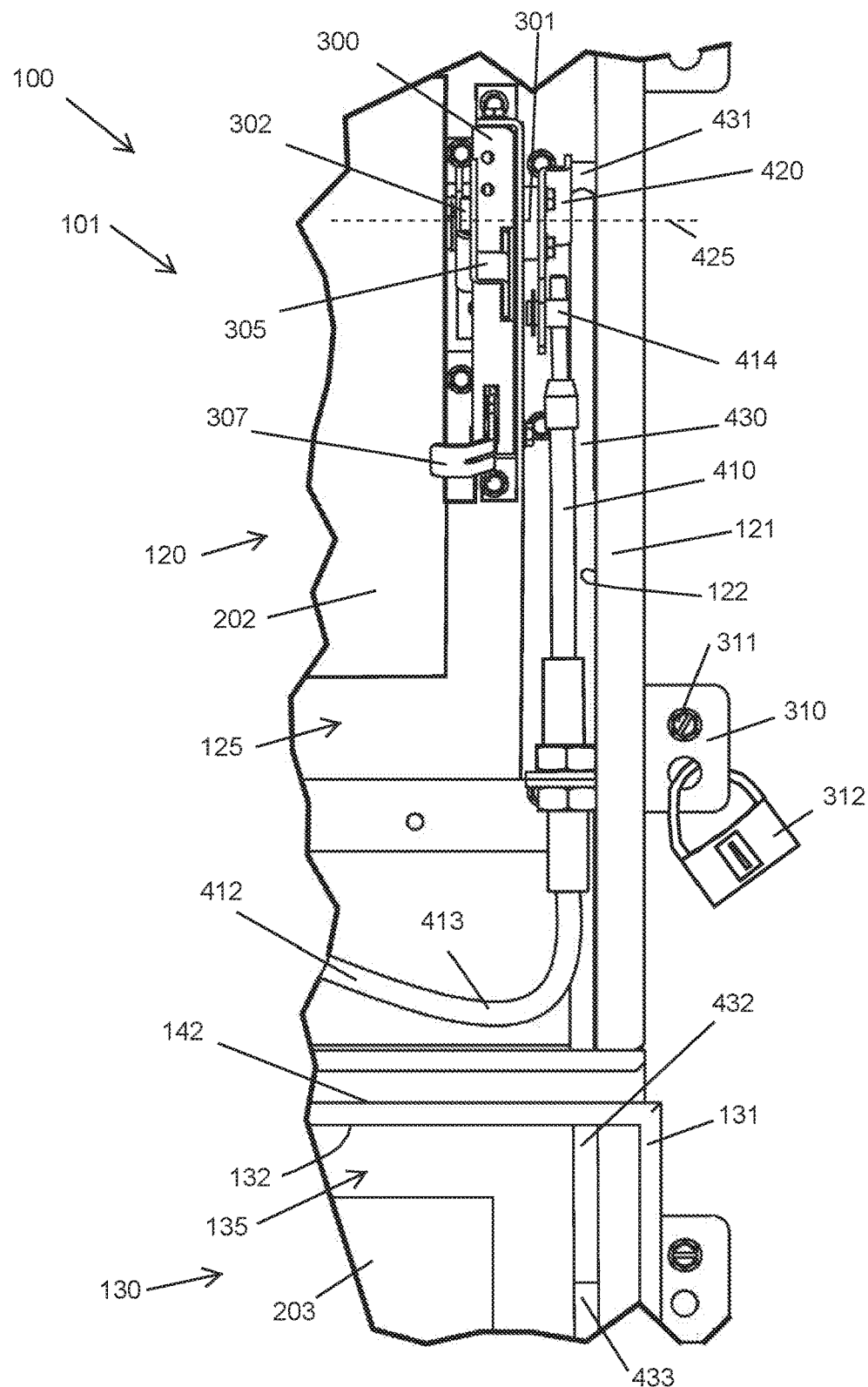
FIG. 3 is an enlarged view of a portion of the exemplary interlocking assembly of FIG. 2 taken at view 3 of FIG. 2, in accordance with embodiments of the disclosure.
Figure 5:
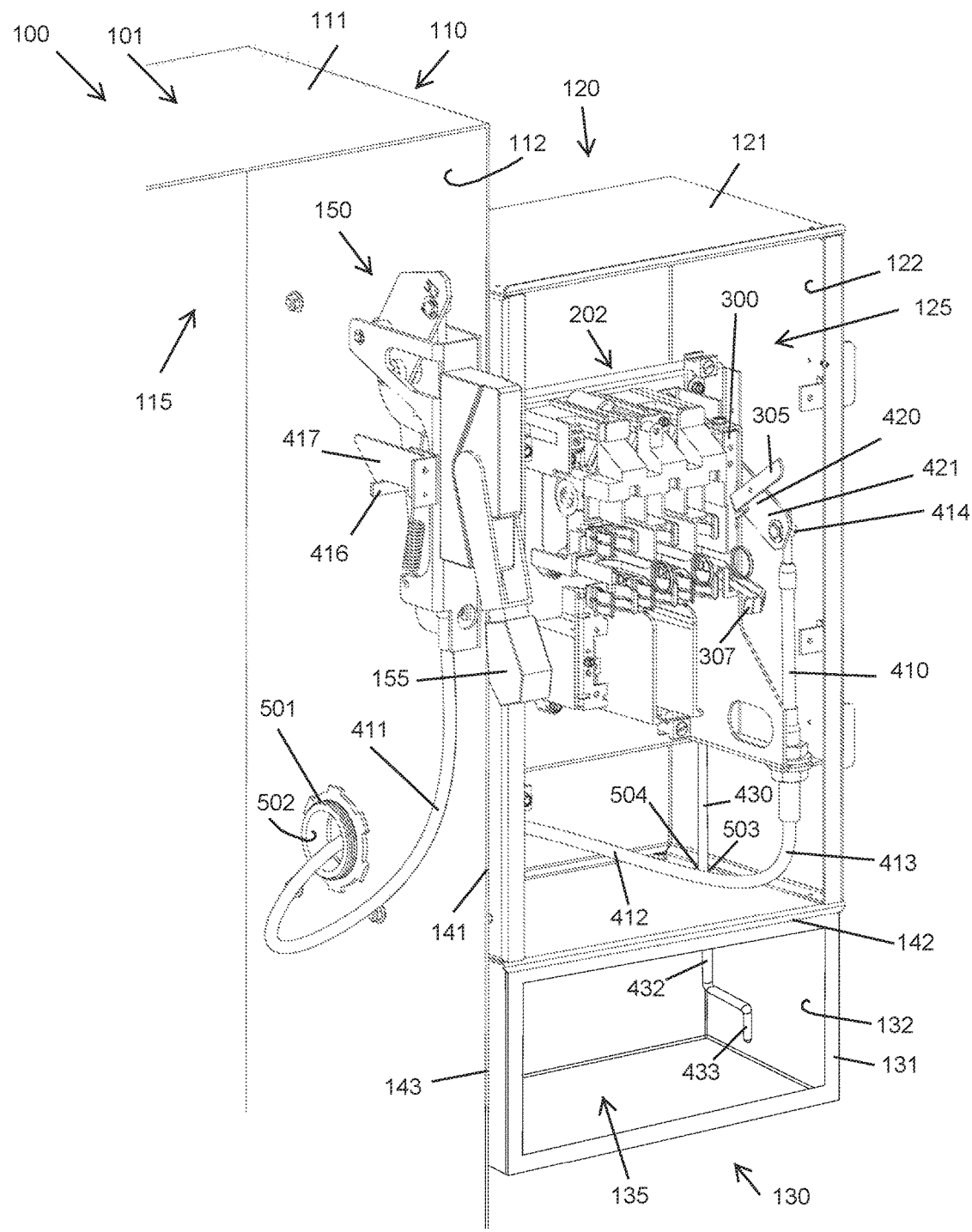
FIG. 5 is a front perspective view of an exemplary enclosure assembly including an exemplary interlocking assembly, in accordance with embodiments of the disclosure.

For pictorial purposes, electrical components 201, 202, 203 are schematically illustrated in FIG. 2 and FIG. 3 as rectangles with the understanding that one or more electrical components can be provided without departing from the scope of the disclosure. For example, FIG. 5 shows a more detailed view of some non-limiting, exemplary electrical components 202 in accordance with embodiments of the disclosure.

For purposes of explanation and not limitation, the electrical components 201, 202, 203 disclosed with respect to the cabinets 111, 121, 131 will be described as operating to reduce a voltage of electric power with the understanding that, in some embodiments, a variety of electrical components (including electrical components not explicitly disclosed) can be provided to perform a variety of operations and functions with respect to the electric power without departing from the scope of the disclosure and in accordance with embodiments of the disclosure. Thus, with reference to FIG. 2, for purposes of explanation and not limitation, the enclosure assembly 100 will be described as receiving voltage V3 (e.g., from one or more active devices external to the interior volume 135 of cabinet 131) at electrical component 203 contained within the interior volume 135 of cabinet 131; reducing voltage V3 to voltage V2; supplying voltage V2 from the interior volume 135 of cabinet 131 to electrical component 202 contained within the interior volume 125 of cabinet 121; reducing voltage V2 to voltage V1, supplying voltage V1 from the interior volume 125 of cabinet 121 to electrical component 201 contained within the interior volume 115 of cabinet 111; reducing voltage V1 to voltage V0; and supplying voltage V0 from the interior volume 115 of cabinet 111 to one or more passive devices external to the interior volumes 115, 125, 135 of the respective cabinets 111, 121, 131.

Features and operation of the handle 150 will now be described with reference to FIGS. 2-5, with respect to operating (e.g., moving, lifting, pressing, twisting, pushing pulling, displacing, translating, rotating) the handle 150 to lock and unlock one or more of the doors 113a, 113b, 123, 133 of the cabinets 111, 121, 131. As shown in FIG. 2, in some embodiments, the handle 150 can include a lever 155 operable between an "ON" position and an "OFF" position. For purposes of the disclosure, the "ON" position will be described as corresponding to a condition where electric power is present within the interior volumes 115, 125, 135 of the cabinets 111, 121, 131, and the doors 113a, 113b, 123, 133 are positioned in a closed, locked position, thereby restricting access into the interior volumes 115, 125, 135 of the closed cabinets 111, 121, 131. Conversely, for purposes of the disclosure, the "OFF" position will be described as corresponding to a condition where electric power is not present within at least one of the interior volumes 115, 125, 135 of the cabinets 111, 121, 131, and one or more of the doors 113a, 113b, 123, 133 is positioned in an unlocked, open position, thereby providing access into the interior volumes 115, 125, 135 of the one or more unlocked, open cabinets 111, 121, 131. For example, in some embodiments, the "ON" position can correspond to a normal operating condition where a user may not have access to the interior volumes 115, 125, 135, and the "OFF" position can correspond to an abnormal operating condition where a user may have access to one or more of the interior volumes 115, 125, 135 to perform one or more of inspection, maintenance, testing, repair, and replacement of the electrical components 201, 202, 203 contained within the one or more interior volumes 115, 125, 135.

Operation of the handle 150 can further control the presence or absence of electric power within one or more of the interior volumes 115, 125, 135. For example, in some embodiments, the "OFF" position can correspond to an abnormal operating condition where the flow of electric power to one or more of the electrical components 201, 202, 203 contained within the one or more interior volumes 115, 125, 135 can be interrupted, thereby reducing and preventing the risk of electric shock to a user accessing the one or more interior volumes 115, 125, 135. Conversely, in some embodiments, the "ON" position can correspond to a normal operating condition where the flow of electric power to the electrical components 201, 202, 203 contained within the interior volumes 115, 125, 135 is not interrupted, thereby restricting unauthorized access to the electric power contained within the interior volumes 115, 125, 135, and increasing the likelihood of safe and effective operation of the enclosure assembly 100 for electrical distribution.

Figure 4:
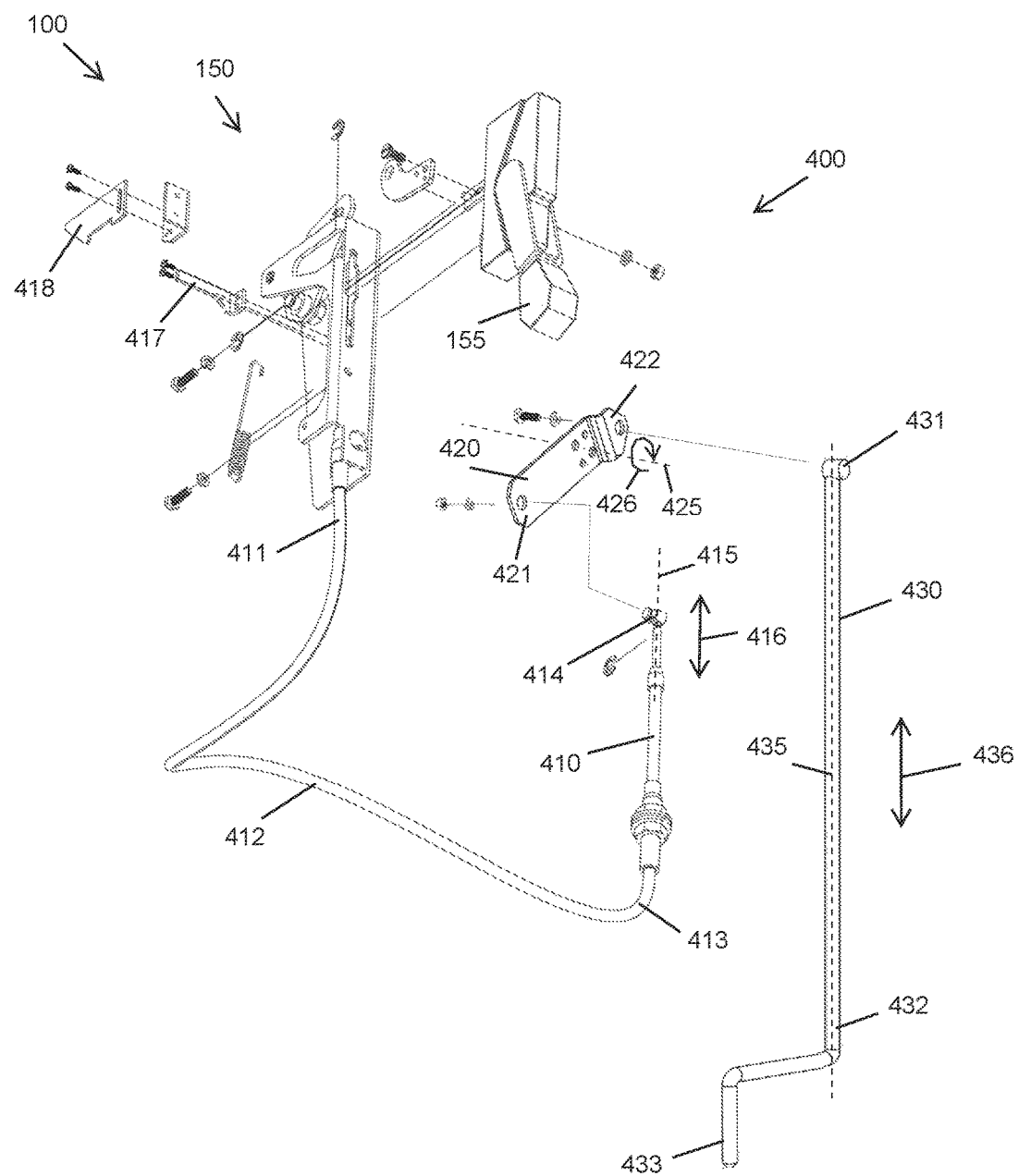
FIG. 4 is an exploded perspective view of an exemplary interlocking assembly for an enclosure assembly, in accordance with embodiments of the disclosure.

As shown in FIG. 4, in some embodiments the enclosure assembly 100 includes an interlocking device 400 oriented to provide the fastening operability (e.g., locking and unlocking) of the doors 113a, 113b, 123, 133. For example, the interlocking device 400 can include the handle 150 and the lever 155. The interlocking device 400 further includes an actuator 410 including a cable 412 (e.g., a cable actuator). The cable 412 includes a first end 411 operably connected to the handle 150 and a second end 412 operably connected to the actuator 410. The actuator 410 includes a tip portion 414 that is moveable along an axis 415 in a direction 416 based on operation of the actuator 410. For example, operation of the lever 155 of the handle 150 can cause the cable 412 to operate the actuator 410, thereby translating the tip portion 414 relative to the actuator 410 along axis 415 in direction 416. In some embodiments, the actuator 410 can define a linear actuator where operation of the actuator 410 by the cable 412 can define movement (e.g., translation) of the tip portion 414 of the actuator 410 along, for example, a linear stroke of the actuator 410.

Additionally, in the illustrated embodiment, the tip portion 414 of the actuator 410 can be coupled to a linkage 420. In some embodiments, the linkage can include a first end 421 to which the tip portion 414 of the actuator 410 can be coupled and a second end 422. Moreover, in some embodiments, the linkage can define a rotation axis 425 between the first end 421 and the second end 422 about which the first end 421 and the second end 422 can rotate. Accordingly, in some embodiments, based on translation of the tip portion 414 of the actuator 410, the first end 421 of the linkage 420 can rotate (e.g., as shown by rotation direction 426) about the rotation axis 425, thereby causing the second end 422 of the linkage 420 to rotate about the rotation axis 425 in the rotation direction 426.

In the illustrated embodiment, the interlocking device 400 further includes a link 430 having a first end 431 coupled to the second end 422 of the linkage 420 and a second end 432. The link 430 includes a rod, a shaft, a bar, or other elongated, rigid member. Based on rotation of the second end 422 of the linkage 420 about the rotation axis 425, the first end 431 of the link 430 can move (e.g., translate), thereby causing the second end 432 of the link 430 to correspondingly move (e.g., translate), along axis 435 in direction 436.

Turning back to FIG. 2, the interlocking device 400 can interlock one or more of the enclosures 110, 120, 130. For example, the handle 150 and its operation can interlock with cabinet 111 of the first enclosure 110. In some embodiments, the cable 412 and the actuator 410 can interlock the operation of the handle 150 from cabinet 111 with cabinet 121 of the second enclosure 120. Likewise, the linkage 420 and the link 430 can interlock the operation of the cable 412 and the actuator 410 with cabinet 131 of the third enclosure 130.

Accordingly, in some embodiments, the first end 411 of the cable 412 can be disposed in the interior volume 115 of cabinet 111 to be operated by operation of the handle 150, and the second end 413 of the cable 412 can be disposed in the interior volume 125 of cabinet 121 to operate the actuator 410 disposed in the interior volume 125 of cabinet 121. The cable 412 can extend from the interior volume 125 of cabinet 121 through an aperture 501 defining an opening 502 in the boundary 141 between cabinet 111 and cabinet 121 into the interior volume 125 of cabinet 121.

The linkage 420 can be disposed in the interior volume 125 of cabinet 121 to operate (e.g., rotate), based on operation (e.g., translation) of the tip portion 414 of the actuator 410. The first end 431 of the link 431 can be disposed in the interior volume 125 of cabinet 121 to operate (e.g., translate), based on operation (e.g., rotation) of the linkage 420, and the second end 432 of the link 430 can be disposed in the interior volume 135 of cabinet 131 to operate (e.g., translate), based on operation (e.g., rotation) of the linkage 420 disposed in the interior volume 125 of cabinet 121. For example, in some embodiments, as shown in FIG. 5 which schematically illustrates a detailed perspective view of the enclosure assembly 100 with doors 113a, 113b, 123, 133 removed for pictorial clarity, the link 430 can extend from the interior volume 125 of cabinet 121 through an aperture 502 defining an opening 503 in the boundary 142 between cabinet 121 and cabinet 131 into the interior volume 135 of cabinet 131.

In some embodiments, with respect to the enclosure assembly 100, operation of the interlocking device 400 can control one or more of locking and unlocking of one or more of doors 113a, 113b, 123, 133, as well as allowing or interrupting the flow of electric power between and among one or more of the electrical components 201, 202, 203 contained within the interior volumes 115, 125, 135 of the cabinets 111, 121, 131. For example, turning back to FIG. 2 and FIG. 3, the interlocking device 400 can include an electrical safety switch 300. With further reference to FIG. 5, the electrical safety switch 300 can include one or more mechanical, electrical, and electro-mechanical components operable to control (e.g., interrupt) the flow of electric power to or from the electrical components 202. Moreover, although described with respect to electrical components 202 contained within the interior volume 125 of cabinet 121, unless otherwise noted, it is to be understood that one or more additional electrical safety switches including, in some embodiments, the same or similar features as electrical safety switch 300 can be provided, either alone or in combination, to control the flow of electric power to or from the electrical components 201 contained within the interior volume 115 of cabinet 111 and the electrical components 203 contained within the interior volume 135 of cabinet 131 without departing from the scope of the disclosure, in accordance with embodiments of the disclosure.

In some embodiments, operation of the electrical safety switch 300 can be controlled, based on operation of the interlocking device 400. For example, as shown in FIG. 2, in some embodiments, the linkage 420 can be rotatably mounted relative to the electrical safety switch 300. Additionally, in some embodiments, a first coupler 301 can interlock the interlocking device 400 (e.g., linkage 420) with the electrical safety switch 300, and a second coupler 302 can interlock the electrical safety switch 300 with the electrical components 202. Accordingly, in some embodiments, operation of the interlocking device 400 in accordance with embodiments of the disclosure can control the flow of electric power to or from the electrical components 202 contained within the interior volume 125 of cabinet 121. For example, as shown in more detail in FIG. 3, in some embodiments, the electrical safety switch 300 can include an interrupt switch 305, the operation of which can interrupt the flow of electric power through (e.g., across) the safety switch 300. Additionally, in some embodiments, the safety switch 300 can include a second locking fastener (e.g., latch 307), the operation of which can engage or disengage a mating feature (not shown) on the door 123 (e.g., on the inside, rear surface of the door 123).

Accordingly, in some embodiments, operation of the lever 155 of the handle 150 can likewise operate the safety switch 300 to selectively engage and disengage the latch 307, thereby locking and unlocking door 123 of the cabinet 121 of the second enclosure 120 based at least in part on operation interlocking device 400. Moreover, in addition or alternatively, operation of the lever 155 of the handle 150 can likewise operate the safety switch 300 to selectively allow or interrupt the flow of electric power to or from the electrical components 202 contained within the interior volume 125 of the cabinet 121 of the second enclosure 120 based at least in part on operation interlocking device 400.

Figure 6:
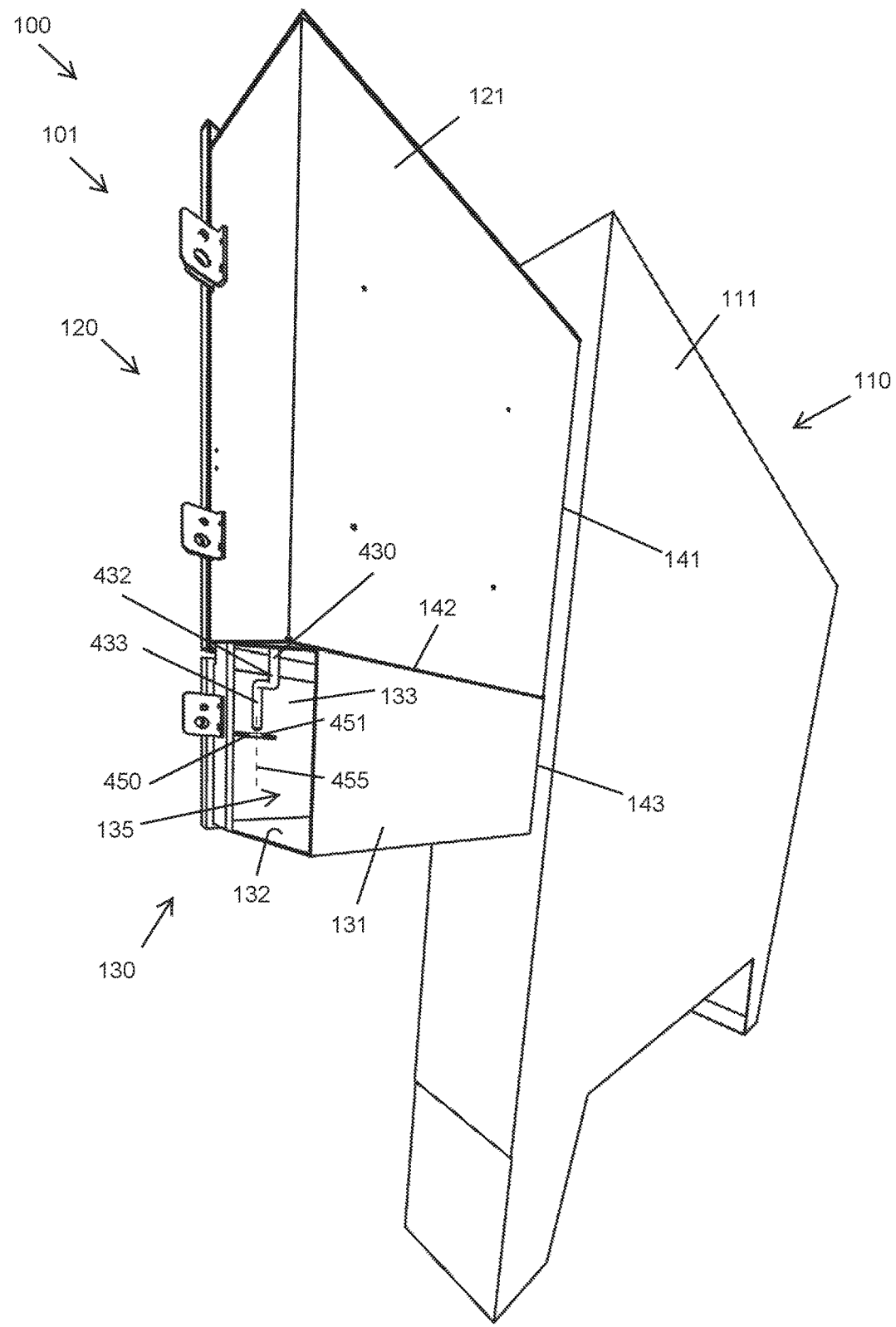
FIG. 6 is a rear perspective view of an exemplary enclosure assembly including an exemplary interlocking assembly, in accordance with embodiments of the disclosure.

Similarly the link 430 can include a pin portion 433 defined at the second end 432 of the link 430. For example, as shown in FIG. 6, which schematically illustrates a rear perspective view of the enclosure assembly 100 with a portion of cabinet 131 of the third enclosure 130 cut-away for pictorial clarity, movement (e.g., translation) of the second end 432 of the link 430 can correspondingly move (e.g., translate) the pin portion 433 of the link 430 along path 455. In some embodiments, the cabinet 131 can include a third locking fastener including a hasp 450 including a slot 451. In some embodiments, the hasp 450 can be attached to the door 133 (e.g., on the inside, rear surface of the door 133) of the cabinet 131 and the pin portion 433 of the link 430 can be oriented to engage and disengage the slot 451 of the hasp 450 based on movement (e.g., translation) of the pin portion 433 of the link 430 along the path 455. Accordingly, in some embodiments, operation of the lever 155 of the handle 150 can likewise operate the pin portion 433 to selectively engage and disengage the slot 451 of the hasp 450, thereby locking and unlocking door 133 of the cabinet 131 based at least in part on operation interlocking device 400.

Additionally, with reference to FIG. 4 and FIG. 5, operation of the lever 155 of the handle 150 can operate a first locking fastener to selectively lock and unlock one or more doors 113a, 113b of the cabinet 111 of the first enclosure 110. For example, in some embodiments, the first locking fastener can include a catch 417 and a mating lever 418. In some embodiments, the catch 417 can be connected to the handle 150, and the mating lever 418 can be connected to one or more doors 113a, 113b of the cabinet 111. Accordingly, in some embodiments, operation of the lever 155 of the handle 150 can likewise operate the mating lever 418 to selectively engage and disengage the catch 417, thereby locking and unlocking the one or more doors 113a, 113b of the cabinet 111 based at least in part on operation of interlocking device 400.

As shown in FIG. 3, in addition to the interlocking device 400, in some embodiments, the enclosure assembly 100 can include one or more additional locking fasteners to add additional levels of safety and security to the enclosure assembly 100. For example, as described with respect to cabinet 121, yet equally as applicable to cabinet 111 and cabinet 131, in some embodiments, the cabinet 121 can include a flange 310 defining an additional locking fastener including, but not limited to, one or more of a bolt fastener 311 and a padlock 312.

Moreover, in some embodiments, certain compliance standards (e.g., engineering codes, employer guidelines, national or societal regulations) may dictate certain clothing (e.g., personal protective equipment) and/or tools that may be employed when, for example, a user interacts with different voltage levels of electric power. For example, without intending to be bound by theory, in some embodiments, exposure to high levels of voltage (e.g., greater than 20 V, greater than 50 V, greater than 100 V) of electric power can be dangerous and deadly to human users. Therefore, in some embodiments, certain compliance standards may be imposed when human users test, maintain, repair, replace, or otherwise interact with and access enclosure assemblies 100 for electrical distribution, where such standards provide guidance with respect to the level of protective equipment employed corresponding to the voltage level of electric power to which the user may be exposed. In some embodiments, higher levels of protective equipment corresponding to potential exposure to higher levels of voltage may likewise entail relatively lengthy time periods for preparation as well as cumbersome or uncomfortable equipment that can slow down or impede the user's ability to work on or in the enclosure assembly 100.

For purposes and explanation and not limitation, with reference to FIG. 2 and FIG. 1, it can be envisioned that one application in which the enclosure assembly 100 for electrical distribution may find utility is when a high voltage (e.g., V3) requiring a user to wear higher levels of protective equipment is supplied to cabinet 131, yet a repair is to be performed within the interior volume 115 of cabinet 111. As noted, in some embodiments, the voltage V1 present in the interior volume 115 of cabinet 111 may impose relatively lesser restrictions on a user with respect to protective equipment based at least in part on the relatively lower voltage (e.g., $V1 \ll V3$). It can be seen that by employing the enclosure assembly 100 in accordance with embodiments of the disclosure that, in some embodiments, based at least in part on operation of the interlocking device 400, door 133 of cabinet 133 can remain locked and closed (e.g., by addition of one or more additional locking fasteners 311, 312) while doors 113a, 113b of cabinet 111 can be unlocked and opened. Furthermore, because the interlocking device 400 can interrupt the flow of electric power to or from the electrical components 201, 202, 203, a user can, therefore, perform a repair within the interior volume 115 of cabinet 111 (without employing high levels of protective equipment) while, nonetheless a higher voltage may be present in the closed, locked cabinet 131 user access to which is restricted, based at least in part on features and operation of the interlocking device 400.

Accordingly and in accordance with embodiments of the disclosure, in some embodiments, with respect to the enclosure assembly 100, operation of the interlocking device 400 can control one or more of locking and unlocking one or more of doors 113a, 113b, 123, 133, as well as allowing or interrupting the flow of electric power between and among the electrical components 201, 202, 203 contained within the interior volumes 115, 125, 135 of the cabinets 111, 121, 131. Thus, in some embodiments, the enclosure assembly 100 including the plurality enclosures 101 for electrical distribution, including one or more features in accordance with embodiments of the disclosure can provide safe and effective distribution of electric power.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative system and method, and illustrative examples shown and described. Accordingly, departures may be made from such details without departing from the spirit or scope of the applicant's general inventive concept.

What is claimed is:

1. An enclosure assembly comprising:
   a plurality of enclosures, each enclosure of the plurality of enclosures including a cabinet having an interior surface defining an interior volume, and a door mounted relative to a respective opening of each cabinet, wherein
      the door is oriented to provide access into the respective interior volume of each respective cabinet when the door is positioned in an open position relative to the respective opening, and wherein
      the door is oriented to restrict access into the respective interior volume of each respective cabinet when the door is positioned in a closed position relative to the respective opening; and
   an interlocking device interlocking a locking fastener of each of a first door of a first enclosure of the plurality of enclosures, a second door of a second enclosure of the plurality of enclosures, and a third door of a third enclosure of the plurality of enclosures, wherein
      the interlocking device is operable to selectively engage the locking fastener of each of the first door, the second door, and the third door to fasten each of the first door, the second door, and the third door in the closed position.

2. The enclosure assembly of claim 1, wherein the interlocking device comprises a cable actuator including a cable and an actuator, wherein the actuator includes a tip portion coupled to a first end of a linkage, and wherein the interlocking device includes a link comprising a first end coupled to a second end of the linkage.

3. The enclosure assembly of claim 2, wherein the linkage defines a rotation axis between the first end of the linkage and the second end of the linkage about which the first end of the linkage and the second end of the linkage are rotatable.

4. The enclosure assembly of claim 3, wherein the linkage is rotatably mounted, with respect to the rotation axis, relative to an electrical safety switch operable to selectively interrupt an electrical circuit based at least in part on rotation of the linkage about the rotation axis.

5. The enclosure assembly of claim 4, wherein the electrical safety switch includes a latch operable to selectively engage a mating fastener based at least in part on rotation of the linkage about the rotation axis.

6. The enclosure assembly of claim 2, wherein the actuator of the cable actuator is disposed within the interior volume of the second cabinet, wherein a first end of the cable of the cable actuator is disposed within the interior volume of the first cabinet, and wherein a second end of the cable of the cable actuator is operably connected to the actuator.

7. The enclosure assembly of claim 6, wherein the first end of the cable of the cable actuator is operably connected to a handle, and wherein the handle is oriented to operate the cable actuator to translate the tip portion of the actuator relative to the actuator.

8. The enclosure assembly of claim 7, wherein the handle includes a catch and a mating lever oriented to selectively fasten the first door in the closed position based at least in part on operation of the handle.

9. The enclosure assembly of claim 6, wherein the link includes a second end disposed within the interior volume of the third cabinet.

10. The enclosure assembly of claim 9, wherein the second end of the link includes a pin portion oriented to selectively engage a slot of a hasp on the third door based at least in part on actuation of the actuator to selectively fasten the third door in the closed position.

11. An enclosure assembly comprising:
    a plurality of enclosures, each enclosure of the plurality of enclosures including a cabinet having an interior surface defining an interior volume, and a door mounted relative to a respective opening of each cabinet; and
    an interlocking device interlocking a first door of a first enclosure of the plurality of enclosures, a second door of a second enclosure of the plurality of enclosures, and a third door of a third enclosure of the plurality of enclosures, wherein
       the second enclosure is mounted relative to the first enclosure at a first interface defining a first boundary between the first cabinet and the second cabinet, and wherein the third enclosure is mounted relative to the second enclosure at a second interface defining a second boundary between the second cabinet and the third cabinet; wherein
       the enclosure assembly includes a first aperture defining a first opening in the first boundary and a second aperture defining a second opening in the second boundary; wherein
       the interlocking device comprises a cable actuator including a cable extending from the interior volume of the first cabinet through the first opening in the first boundary to the interior volume of the second cabinet; and wherein
       the interlocking device comprises a link including a first end disposed in the interior volume of the second cabinet and a second end disposed in the interior volume of the third cabinet, wherein the link extends from the interior volume of the second cabinet through the second opening in the second boundary to the interior volume of the third cabinet.

12. The enclosure assembly of claim 11, wherein each door is oriented to provide access into the respective interior volume of each respective cabinet when the door is positioned in an open position relative to the respective opening, wherein each door is oriented to restrict access into the respective interior volume of each respective cabinet when the door is positioned in a closed position relative to the respective opening, and wherein the interlocking device is operable to selectively fasten each of the first door, the second door, and the third door in the closed position.

13. The enclosure assembly of claim 12, wherein the second end of the link includes a pin portion oriented to selectively engage a slot of a hasp on the third door based at least in part on actuation of the actuator to selectively fasten the third door in the closed position.

14. The enclosure assembly of claim 11, wherein the interlocking device includes a linkage, wherein the actuator comprises a tip portion coupled to a first end of the linkage, and wherein the first end of the link is coupled to a second end of the linkage.

15. The enclosure assembly of claim 14, wherein the linkage defines a rotation axis between the first end of the linkage and the second end of the linkage about which the first end of the linkage and the second end of the linkage are rotatable.

16. The enclosure assembly of claim 15, wherein the linkage is rotatably mounted, with respect to the rotation axis, within the interior volume of the second cabinet.

17. An interlocking device for interlocking a plurality of doors of a plurality of enclosures, the interlocking device comprising:

a linkage defining a rotation axis between a first end of the linkage and a second end of the linkage about which the first end of the linkage and the second end of the linkage are rotatable;

a cable actuator including a cable and an actuator, wherein the actuator includes a tip portion coupled to the first end of the linkage; and a link including a first end coupled to the second end of the linkage, and a second end having a pin portion, wherein the pin portion is oriented to selectively engage a slot of a hasp on a door of the plurality of doors based at least in part on actuation of the actuator.

18. The interlocking device of claim 17, further comprising a handle operably connected to the cable of the actuator, wherein the handle is oriented to operate the cable actuator to translate the tip portion of the actuator relative to the actuator.

19. The interlocking device of claim 18, wherein the linkage is oriented to rotate about the rotation axis based at least in part on translation of the tip portion of the actuator relative to the actuator.

20. The interlocking device of claim 19, wherein the pin portion of the link is oriented to translate along a path based at least in part on rotation of the linkage about the rotation axis.

* * * * *